US012790710B2

(12) United States Patent
Behnke et al.

(10) Patent No.: US 12,790,710 B2
(45) Date of Patent: Nov. 10, 2026

(54) POROUS CHAMBER COMPONENT COATING AUGMENTED WITH COLLOIDS

(71) Applicant: Applied Materials, Inc., Santa Clara, CA (US)

(72) Inventors: Joseph Frederick Behnke, San Jose, CA (US); Joseph Frederick Sommers, Roseville, CA (US); Alexander Alhajj Sulyman, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 208 days.

(21) Appl. No.: 18/508,056

(22) Filed: Nov. 13, 2023

(65) Prior Publication Data

US 2024/0158944 A1 May 16, 2024

Related U.S. Application Data

(60) Provisional application No. 63/384,072, filed on Nov. 16, 2022.

(51) Int. Cl.

| | |
|---|---|
| ***C25D 11/18*** | (2006.01) |
| ***C23C 4/11*** | (2016.01) |
| ***C23C 4/18*** | (2006.01) |
| ***H10P 72/76*** | (2026.01) |
| *C23C 4/134* | (2016.01) |

(52) U.S. Cl.

CPC ................ *C25D 11/18* (2013.01); *C23C 4/11* (2016.01); *C23C 4/18* (2013.01); *H10P 72/7616* (2026.01); *C23C 4/134* (2016.01)

(58) Field of Classification Search

CPC .. C25D 11/18; C23C 4/11; C23C 4/18; H01L 21/68757

See application file for complete search history.

(56) References Cited

U.S. PATENT DOCUMENTS

| | | | | |
|---|---|---|---|---|
| 5,705,225 | A | 1/1998 | Dornfest et al. | |
| 9,850,568 | B2 | 12/2017 | Sun et al. | |
| 12,247,296 | B2 | 3/2025 | Hanamachi et al. | |
| 2007/0110991 | A1 | 5/2007 | Apte et al. | |
| 2008/0135998 | A1 | 6/2008 | Witvrouw et al. | |
| 2014/0262790 | A1 | 9/2014 | Levendusky et al. | |
| 2017/0229252 | A1 | 8/2017 | Ahopelto et al. | |
| 2018/0327899 | A1* | 11/2018 | Wu | C23C 16/30 |
| 2022/0184561 | A1* | 6/2022 | Huang | B01D 69/108 |

FOREIGN PATENT DOCUMENTS

| | | | |
|---|---|---|---|
| EP | 3826435 | A1 | 5/2021 |
| KR | 20210059095 | A | 5/2021 |
| WO | 2022158723 | A1 | 7/2022 |

OTHER PUBLICATIONS

International Search Report and Written Opinion for International Application No. PCT/US2023/079664, mailed Mar. 19, 2024, 11 Pages.

* cited by examiner

*Primary Examiner* — Nathan T Leong
(74) *Attorney, Agent, or Firm* — Lowenstein Sandler lLP

(57) ABSTRACT

A method includes forming a porous ceramic coating on a component of a processing chamber. The method further includes applying a colloidal suspension to the porous ceramic coating to fill pores of the porous ceramic coating. The method further includes drying the component.

10 Claims, 4 Drawing Sheets

POROUS CHAMBER COMPONENT COATING AUGMENTED WITH COLLOIDS

RELATED APPLICATION

This application claims the benefit of U.S. Provisional Application No. 63/384,072, filed Nov. 16, 2022, the content of which is hereby incorporated by reference in its entirety.

TECHNICAL FIELD

The instant specification relates to a protective coating for components of a substrate processing chamber. Specifically, the instant specification relates to a porous coating such as an anodized coating or a plasma sprayed coating of a chamber component augmented with colloidal particles.

BACKGROUND

Chambers are used in many types of processing systems. Examples of chambers include etch chambers, deposition chambers, anneal chambers, and the like. Typically, a substrate, such as a semiconductor wafer, is placed on a substrate support within the chamber and conditions in the chamber are set and maintained to process the substrate. The properties of the substrate support have an effect on the properties of the completed substrate. Components of the processing system may be subject to harsh environments, such as corrosive gases, high electrical charge, elevated temperature, etc.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In one aspect of the disclosure, a method includes forming a porous ceramic layer on a component of a processing chamber. The method further includes applying a colloidal suspension to the porous ceramic layer to fill pores of the porous ceramic layer. The method further includes drying the component.

In another aspect of the disclosure, a chamber component for a processing chamber includes a metal body. The chamber component further includes a porous coating on the metal body. The chamber component further includes a material disposed within pores of the porous coating.

In another aspect of the disclosure, a process chamber includes a substrate support assembly. The substrate support assembly includes a chamber component. The chamber component includes an aluminum body. The chamber component includes a porous aluminum oxide coating. The chamber component includes a fill material disposed within pores of the porous aluminum oxide coating. The substrate support assembly further includes a sealing component. The sealing component is disposed on the aluminum oxide coating of the chamber component to generate a fluid seal.

BRIEF DESCRIPTION OF THE DRAWINGS

The present disclosure is illustrated by way of example, and not by way of limitation in the figures of the accompanying drawings.

DETAILED DESCRIPTION

Figure 1:
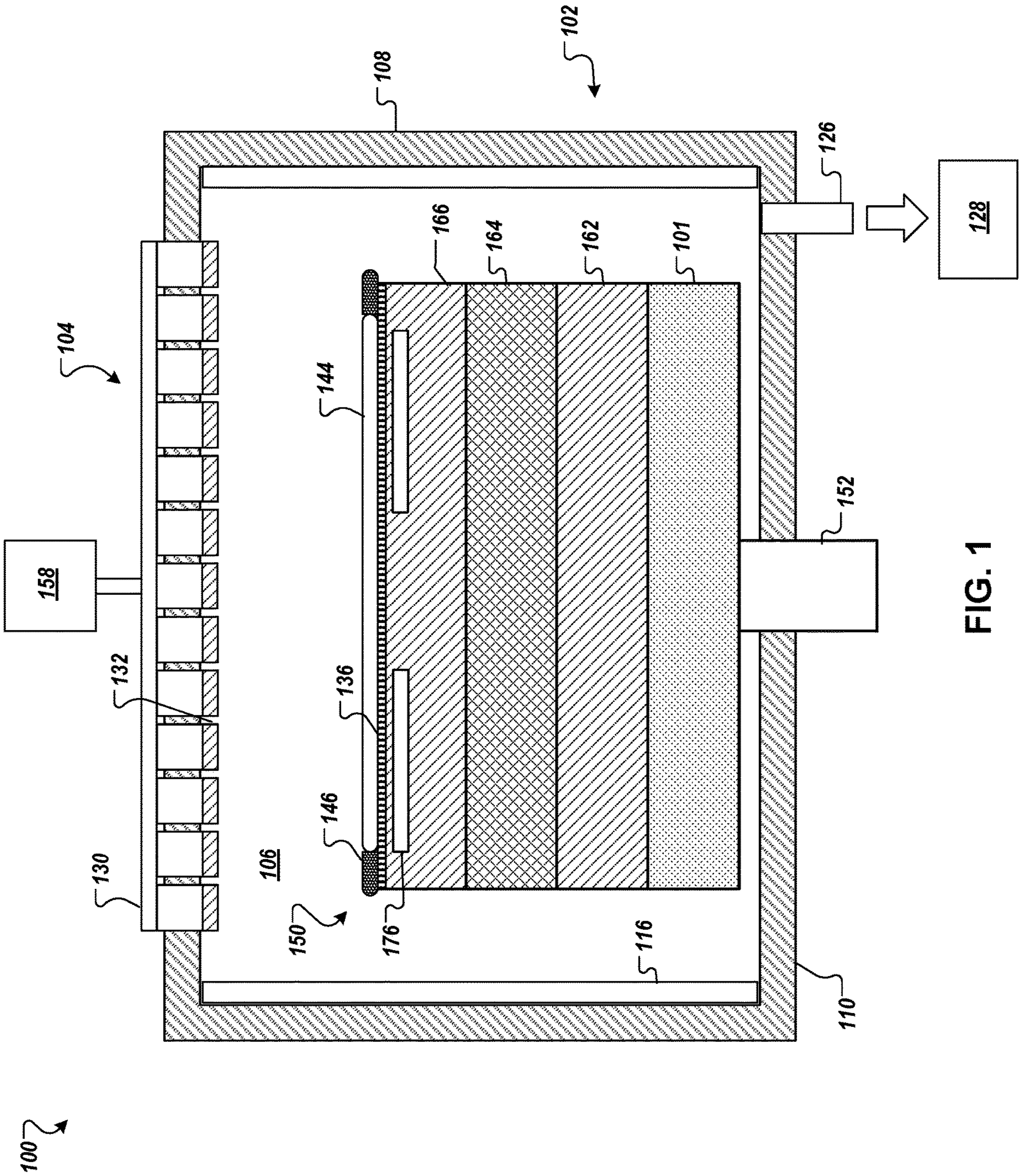
FIG. 1 is a section view of a substrate processing chamber including one or more components with a filled porous protective coating, according to some embodiments.

Embodiments of the present disclosure enable a chamber component including a filled oxide coating. The chamber component may be a component of a substrate support assembly. The chamber component may be configured to generate a fluid seal, e.g., via a sealing component. The oxide coating may include an anodized metal coating, a plasma sprayed coating, or any other type of porous oxide coating. In some embodiments, the coating is a porous fluoride coating or a porous oxy-fluoride coating. The coating layer may include material filling pores of the oxide coating, fluoride coating, or oxy-fluoride coating. The material filling pores of the coating may be a ceramic material, a metal oxide material, a metal fluoride material, a metal oxy-fluoride material, etc. The material filling pores of the coating may be applied via a colloidal suspension of the fill material.

In some conventional systems, metal components are utilized in a process chamber. Process chamber components may be subjected to harsh environments. For example, manufacturing processes performed in the processing chamber may be performed using corrosive gases, plasma, elevated temperatures, etc.

In some systems, components of a processing chamber may be designed, assembled, manufactured, etc., to protect the components from one or more target processing environments. Components of a processing chamber may be provided with a protective coating to protect the components from a processing environment of the processing chamber.

In some systems, one or more components of a processing chamber may be coated with a protective metal oxide coating, a protective metal fluoride coating, or a protective metal oxy-fluoride coating. One or more components of a processing chamber may include an outer coating comprising of an oxide of the metal the component is made of. The oxide coating, oxide layer, etc., may be applied to the component, or may be generated from material of the component. Alternatively, the metal of the oxide coating may be a different metal than the metal of the component. Similarly, one or more components of a processing chamber may include a metal fluoride coating or layer and/or a metal oxy-fluoride coating or layer, where the metal may be a same metal as the metal of the component or a different metal from the metal of the component.

In some systems, a protective oxide layer may be generated by anodization of the component. A protective oxide layer may be porous. For example, anodized aluminum may generate approximately cylindrical pores that extend through at least a portion of a thickness of the anodized coating. Anodization of other materials (e.g., other metals, metal alloys, etc.) may generate similar structures.

In some systems, a protective oxide layer, fluoride layer, or oxy-fluoride layer may be formed by performing a deposition process that produces a porous layer. One example of a deposition process that may be used is plasma spraying such as air plasma spraying.

In embodiments, the porous oxide layer, fluoride layer, or oxy-fluoride layer has a porosity of 1% to 15%, where the porosity is a percentage of void space in the layer. Examples of upper and lower ends of the porosity include 1%, 2%, 3%, 4%, 5%, 6%, 7%, 8%, 9%, 10%, 11%, 12%, 13%, 14% and 15%.

In some systems, a porous oxide layer may be sealed by converting at least a portion of the metal oxide to a hydroxide form. Converting of the metal oxide to a hydroxide form may include exposing the coating to water. Converting the metal oxide to a hydroxide form may include exposing the coating to heated (e.g., boiling) water. Converting the metal oxide to a hydroxide form may close or partially close holes, pores, or the like, of the metal oxide coating.

There are a number of shortcomings of conventional systems. A treated oxide protective layer (e.g., treated to close pores, treated to generate a hydroxide form, treated by application of heated water, etc.) may be sensitive to process environment. For example, vacuum conditions and/or elevated temperatures may remove water from a treated oxide layer. Vacuum conditions and/or elevated temperatures may cause a sealed, treated, or closed oxide layer to become porous. Porous protective layers may provide reduced protection to coated components. Some unprotected material may be accessible through pores of the porous coating. In some areas, a thin layer of protective coating may separate unprotected (e.g., bulk) material from an ambient environment, from pores accessible to gas of the ambient environment, etc. Porous protective layers may provide reduced dielectric breakdown resistance compared to non-porous protective layers. A thin layer of insulating coating may separate a core material of a component from an ambient environment, from a pore, or the like. Porous protective layers may increase difficulty of generating a fluid seal. A porous surface may provide vacuum leak paths, e.g., for a gas to bypass a sealing component such as an O-ring, a gasket, or the like.

Aspects of the present disclosure may alleviate one or more of the shortcomings of conventional systems. In some embodiments, a component for a process chamber is provided. The component may be made of one or more metals. The component may include one or more metal materials. The component may be a component intended to hold a fluid seal in a process chamber. The component may be configured to define a portion of a sealed volume, e.g., the component may be configured to be seated adjacent to a sealing component such as an O-ring, gasket, etc. The component may be aluminum. The component may be a component of a substrate support assembly.

In some embodiments, a porous protective layer is be generated on the component. The porous protective layer may be of a metal oxide, a metal fluoride, or a metal oxy-fluoride. The porous protective layer may be generated by anodization of the component. The porous protective layer may be of alumina ($Al_2O_3$).

In some embodiments, a material may be applied to the porous coating. The material may fill, partially fill, block, or the like, pores of the porous coating. The material applied to the porous coating may be a suspension. The material applied to the porous coating may include colloidal particles. The material applied to the porous coating may include a ceramic material, a metal oxide, metal fluoride, and/or metal oxy-fluoride.

In some embodiments, a colloidal material may be chosen based on a strength of interaction with a material of the porous coating. For example an aluminum oxide coating may interact strongly with aluminum oxide colloidal particles. In some embodiments, a material of colloidal particles may be chosen to correspond to the material of the porous coating, such as a silica coating being treated with silica particles, a yttrium aluminum garnet (YAG) coating being treated with YAG particles, or the like. The material applied to the porous coating may include the same ceramic material, metal oxide, metal fluoride, or metal oxy-fluoride as comprises the porous protective layer. The material applied to the porous coating may be a colloidal suspension of ceramic material, metal oxide, metal fluoride and/or metal oxy-fluoride particles. The material applied to the porous coating may be a colloidal suspension of alumina particles in one example.

In some embodiments, the suspension of colloidal particles may be a water-based suspension, e.g., may include colloidal particles suspended in water. The water may be deionized, distilled, or otherwise purified. The solution may include one or more additional components. The solution may include additives for adjusting properties of the solution, such as solution pH, solution viscosity, particle surface charge characteristics, material affinities, etc. The solution may include, for example, sodium oxide ($Na_2O$), aluminum oxyhydroxide ($AlO(OH)$), acetate ($CH_3COO$), ammonia ($NH_3$), nitrate ($NO_3$), organic acid stabilizers, surfactants, or other additives. Colloidal particles may be nanoparticles. Colloidal particles may be about 10 nm in size in some embodiments. Colloidal particles may be between 5 nm and 50 nm, between 1 nm and 100 nm, or any subrange of these sizes. Concentration of colloidal particles in a colloidal suspension may vary based on solvent material, target application, particle material, or the like. Concentration of colloidal particles may be about 20% by weight in the colloidal solution. Concentration of colloidal particles may be between 15% and 25% by weight. Concentration of colloidal particles may be between 10% and 30%, between 5% and 40%, any subrange of these ranges, or the like.

Materials for colloid particles may include any material of interest for augmenting properties of a porous coating. Materials for particles for applying to a porous coating may include silica, alumina, yttria, zirconia, yttria-stabilized zirconia, zirconia acetate, etc. Materials for particles may include yttrium-containing compounds such as $Y_4Al_2O_9$, a ceramic compound including $Y_2O_3$ and $ZrO_2$, etc. Materials for particles for applying to a porous coating (and materials for a porous coating, in some embodiments) may include $Er_2O_3$, $ErAl_xO_y$, $YAl_xO_y$, $YZr_xO_y$ and $YZr_xAl_yO_z$, $Gd_2O_3$, $Yb_2O_3$, $Y_2O_3$ stabilized $ZrO_2$ (YSZ), $Er_3Al_5O_{12}$ (EAG), a $Y_2O_3$—$ZrO_2$ solid solution, or a composite ceramic comprising $Y_4Al_2O_9$ and a solid solution of $Y_2O_3$—$ZrO_2$, etc.), ceramic carbides (e.g., silicon carbide SiC, silicon-silicon carbide Si—SiC, boron carbide $B_4C$, etc.), nitride based ceramics (e.g., aluminum nitride AN, silicon nitride SiN, etc.), yttrium fluoride $YF_3$, yttrium oxyfluoride YOF, magnesium oxide, other ceramic materials, or combinations of materials.

In some embodiments, the material applied to the porous coating may be applied by immersing the component in the material, in a solution including the material, in a colloidal suspension including the material, etc. The material may be applied by spraying, brushing, dropping, spreading, or otherwise introducing the material to the porous coating. Application of the material to the porous material may be assisted, e.g., by vacuum assistance, ultrasonic assistance, surface charge assistance, etc. The material may be applied such that the material fills or partially fills pores of the porous protective coating.

In some embodiments, the component may be cured, dried, and/or treated. The component may be dried to remove solvent of a suspension applied to the porous protective coating. The component may be dried to set, fuse, or the like, material occupying pores of the porous protective coating. The component may be dried to set colloidal particles in pores of the protective coating. Drying may drive solvent from pores of the protective coating. Drying may cause colloidal particles to bond together, e.g., setting the particles in pores of the coating. Drying may generate a porous coating with at least partially filled and/or blocked pores.

Aspects of the present disclosure enable technological advantages over conventional systems. In some embodiments, aspects of the present disclosure enable a process chamber component with a filled porous coating. The filled porous coating may provide additional protection to the component, compared to an unfilled porous coating. The filled porous coating may be resilient to process conditions. A filled porous coating may be resistant to elevated temperatures. A filled porous coating may be resistant to vacuum conditions. A filled porous coating may increase a coating thickness between the component and an ambient environment. A filled porous coating may provide additional protection, additional strength, and/or additional lifetime of a protective coating compared to an unfilled coating. A filled porous coating may provide additional resistance to dielectric breakdown than an unfilled porous coating. A filled porous coating may provide additional resistance to dielectric breakdown due to providing an increased thickness of insulating material. A filled porous coating may provide a surface more conducive to forming a seal than an unfilled porous coating. A filled porous coating may provide a smoother surface than an unfilled porous coating. A filled porous coating may provide fewer and/or less significant vacuum leak paths than an unfilled porous coating.

In some aspects of the present disclosure, a method includes anodizing a component of a processing chamber to generate a metal oxide layer of the component. The method further includes applying a colloidal suspension to the metal oxide layer. The method further includes drying the component.

In some aspects of the present disclosure, a chamber component for a processing chamber includes a metal body. The chamber component further includes a porous coating on the metal body. The chamber component further includes a material disposed within pores of the porous coating.

In some aspects of the present disclosure, a processing chamber includes a substrate support assembly. The substrate support assembly includes a chamber component. The chamber component includes an aluminum body. The chamber component further includes a porous aluminum oxide coating. The chamber component further includes a fill material disposed within pores of the porous aluminum oxide coating. The substrate support assembly further includes a sealing component. The sealing component is disposed on the aluminum oxide coating of the chamber component to generate a fluid seal. The sealing component and the chamber component may generate a gas seal.

Embodiments are discussed with regards to filling pores of a metal oxide coating formed by anodization. However, it should be understood that the embodiments discussed with reference to filling pores of metal oxide coatings and anodized layers also apply with respect to filling pores of other types of porous coatings, such as metal oxide coatings, metal fluoride coatings and metal oxy-fluoride coatings deposited by deposition techniques other than anodization (e.g., deposited by plasma spraying).

FIG. 1 is a sectional view of a substrate processing chamber 100 including one or more components with a filled porous coating, according to some embodiments. Substrate processing chamber 100 includes substrate support assembly 150, which includes several components. One or more of the components of substrate support assembly 150 may include a filled porous coating. One or more of the components of substrate processing chamber 100 may include a porous coating with pores filled or partially filled with a colloidal material. One or more components of substrate processing chamber 100 may include a porous coating with particles of metal oxide disposed within pores of the porous coating. Substrate support assembly 150 includes a puck 166 (e.g., may include an electrostatic chuck (ESC)). The puck 166 may perform chucking operations, e.g., vacuum chucking, electrostatic chucking, etc. Puck 166 may include an upper puck plate bonded to a lower puck plate (not shown). Puck 166 may be coupled to a cooling plate 164 (e.g., may be in thermal communication with a cooling plate). Cooling plate 164 may be made of a metal. Cooling plate 164 may be aluminum. Cooling plate 164 may include a filled porous coating. Cooling plate 164 may include an anodized metal oxide coating, with pores filled by metal oxide particles.

Substrate support assembly 150 may further include base plate 162 and insulator plate 101. Base plate 162 may be coupled to puck 166, e.g., may be attached to puck 166 by fasteners. Base plate 162 may support cooling plate 164. Insulator plate 101 may comprise a material that insulates against RF radiation, such as a plastic material, a polymer material (e.g., a cross-linked polymer of polystyrene and divinylbenzene). Base plate 162 may be a metal component. Base plate 162 may be an aluminum component. Base plate 162 may include a filled porous protective layer, such as an anodized aluminum oxide layer filled with alumina particles.

Processing chamber 100 includes chamber body 102 and lid 104 that enclose an interior volume 106. Chamber body 102 may be fabricated from aluminum, stainless steel, or other suitable material. Chamber body 102 generally includes sidewalls 108 and a bottom 110. An outer liner 116 may be disposed adjacent to sidewalls 108, e.g., to protect chamber body 102. Outer liner 116 may be fabricated and/or coated with a plasma or halogen-containing gas resistant material. Outer liner 116 may be fabricated from or coated with aluminum oxide. Outer liner 116 may be fabricated from or coated with yttria, yttrium alloy, oxides thereof, etc.

Exhaust port 126 may be defined in chamber body 102, and may couple interior volume 106 to a pump system 128. Pump system 128 may include one or more pumps, valves, lines, manifolds, tanks, etc., utilized to evacuate and regulate the pressure of interior volume 106.

Lid 104 may be supported on sidewall 108 of chamber body 102. Lid 104 may be openable, allowing access to interior volume 106. Lid 104 may provide a seal for processing chamber 100 when closed. Gas panel 158 may be coupled to processing chamber 100 to provide process, cleaning, backing, flushing, etc., gases to interior volume 106 through gas distribution assembly 130. Gas distribution assembly 130 may be integrated with lid 104.

Examples of processing gases that may be used in processing chamber 100 include halogen-containing gases, such as $C_2F_6$, $SF_6$, $SiCl_4$, HBr, $NF_3$, $CF_4$, $CHF_3$, $CH_2F_3$, $Cl_2$ and $SiF_4$. Other reactive gases may include $O_2$ or $N_2O$. Non-reactive gases may be used for flushing or as carrier gases, such as $N_2$, He, Ar, etc. Gas distribution assembly 130 (e.g., showerhead) may include multiple apertures 132 on the downstream surface of gas distribution assembly 130. Apertures 132 may direct gas flow to the surface of substrate 144. In some embodiments, gas distribution assembly may include a nozzle (not pictured) extended through a hold in lid 104. A seal may be made between the nozzle and lid 104. Gas distribution assembly 130 may be fabricated and/or coated by a ceramic material, such as silicon carbide, yttrium oxide, etc., to provide resistance to processing conditions of processing chamber 100.

Substrate support assembly 150 is disposed in interior volume 106 of processing chamber 100 below gas distribution assembly 130. Substrate support assembly 150 holds a substrate 144 during processing. An inner liner (not shown) may be coated on the periphery of substrate support assembly 148. The inner liner may share features (e.g., materials of manufacture, function, etc.) with outer liner 116.

Substrate support assembly 150 may include supporting pedestal 152, insulator plate 101, base plate 162, cooling plate 164, and puck 166. Puck 166 may include electrodes 136 for providing one or more functions. Electrodes 136 may include chucking electrodes (e.g., for securing substrate 144 to an upper surface of puck 166), heating electrodes, etc.

Protective ring 146 may be disposed over a portion of puck 166 at an outer perimeter of puck 166. Puck 166 may be coated with a protective layer (not shown). The protective layer may be a ceramic such as $Y_2O_3$ (yttria or yttrium oxide), $Y_4Al_2O_9$ (YAM), $Al_2O_3$ (alumina), $Y_3Al_5O_{12}$ (YAG), $YAlO_3$ (YAP), quarta, SiC (silicon carbide), $Si_3N_4$ (silicon nitride), Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may be a ceramic composite such as YAG distributed in an alumina matrix, a yttria-zirconia solid solution, a silicon carbide-silicon nitride solid solution, or the like. The protective layer may be sapphire or MgAlON.

Puck 166 may include an upper puck plate (not shown) and a lower puck plate (not shown) bonded by a metal bond and/or diffusion bond. The upper puck plate may be a dielectric or electrically insulating material (e.g., having an electrical resistivity of greater than $10^{14}$ Ohm·meter) that is usable for substrate processing applications. In some embodiments, the upper puck plate may be made of materials suitable for use from about 20° C. to about 500° C. The upper puck plate may be composed of AlN. An AlN upper puck plate may be doped or undoped. For example, the upper puck plate may be doped with samarium oxide ($Sm_2O_3$), cerium oxide ($CeO_2$), titanium dioxide ($TiO_2$), or a transition metal oxide. The upper puck plate may be composed of $Al_2O_3$. An $Al_2O_3$ upper puck plate may be doped or undoped. For example, the upper puck plate may be doped with titanium dioxide ($TiO_2$) or a transition metal oxide.

Processing chamber 100 may further include a mounting plate (not shown), which is coupled to the bottom 110 of chamber body 102 and includes passages for routing utilities (e.g., fluids, power lines, sensor leads, etc.) to components of substrate support assembly 150. For example, a coolant fluid may be provided via the passages to cooling plate 164, power may be supplied via the passages to electrodes 176 of puck 166, etc.

Heating elements (e.g., electrodes 176 in puck 166, one or more heating elements disposed within cooling plate 164 (not shown), etc.) may be used to control the temperature of puck 166, substrate 144, etc. Puck 166 may include separately controlled heating zones that may maintain different temperatures. Puck 166 may include radial heating zones, segment heating zones, etc. Temperature of puck 166, substrate 144, cooling plate 164, base plate 162, etc., may be monitored by one or more temperature sensors.

Puck 166 may further include multiple gas passages such as grooves, mesas, and other features that may be formed in an upper surface of puck 166. Gas passages may be fluidly coupled to a gas source. Gas from a gas source may be utilized as a heat transfer or backside gas, may be utilized for control of one or more lift pins of puck 166, etc. Multiple gas sources may be utilized. Gas passages may provide a gas flow path for a backside gas such as He via holes drilled in puck 166. Backside gas may be provided at a controlled pressure into gas passages to enhance heat transfer between puck 166 and substrate 144.

Any of the components of the substrate support assembly 150 and/or of the chamber 100 may include a filled porous layer according to embodiments. Components other than components included in substrate support assembly 150 may include a filled porous protective coating. A filled porous protective coating may be a benefit to many components of a process chamber. A filled porous protective coating may increase resistance of a component to a process environment, improve fluid seals involving the component, increase resistance of the component to dielectric breakdown, etc.

Figure 2A:
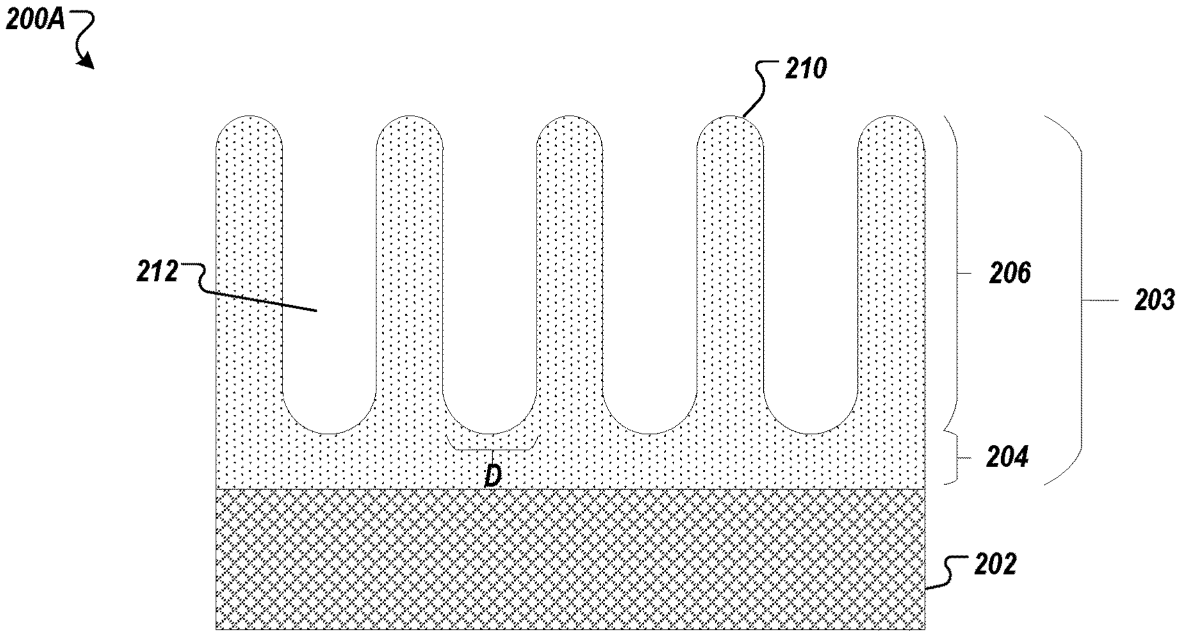
FIG. 2A is a sectional side view of a chamber component for use in a process chamber, according to some embodiments.

FIG. 2A is a cross-sectional view of a chamber component 200A for use in a process chamber (e.g., a semiconductor manufacturing chamber), according to some embodiments. Chamber component 200A includes article 202 and anodization layer 203 on the article. In one embodiment, the anodization layer 203 includes a buffer layer 204 and a porous layer 206. The porous layer 206 includes vertical portions 210 and pores 212 of diameter D between the vertical portions 210. Chamber component 200A is a representation, and not necessarily to scale.

Article 202 may be manufactured of a metal or metal alloy. Article 202 may be aluminum or an aluminum alloy. Article 202 may be of another metal. Article 202 may be of another metal that can be anodized. Article 202 may be of stainless steel, titanium, titanium alloy, yttrium, yttrium alloy, magnesium, magnesium alloy, etc. Article 202 may be any process chamber component, e.g., a component that would benefit from protection of an oxide coating. Article 202 may be a component of a substrate support assembly, such as a cooling plate, base plate, etc.

Article 202 is anodized to form anodization layer 203 on a surface of article 202. Pores 212 are formed between vertical portions 210. Pores 212 may be approximately cylindrical. Pores 212 may be approximately hemispherical bottoms (e.g., adjacent to buffer layer 204). Pores 212 may self-arrange in an approximately hexagonal pattern separated by upright portions 210. A different view of anodization layer 203 is provided in FIG. 3.

Anodization layer 203 may be a metal oxide. Anodization layer 203 may be of a ceramic material. Anodization layer 203 may be alumina ($Al_2O_3$), yttria ($Y_2O_3$), etc. Anodization layer 203 may be of a metal oxide corresponding to the composition of article 202. For example, if article 202 is aluminum or an aluminum alloy, the anodization layer may be alumina. If article 202 is yttrium or a yttrium alloy, anodization layer 203 may be yttria. If article 202 is magnesium or a magnesium alloy, anodization layer 203 may be magnesia, MgO. Anodization layer 203 may be formed to have a target thickness. The thickness of anodization layer 203 may be micrometers thick. Anodization layer 203 may be about 50 μm thick. Anodization layer 203 may be between 25 μm and 75 μm thick. Anodization layer 203 may be between about 5 μm and 200 μm thick, or any subrange of these values. Pores 212 of anodization layer 203 may be of a target diameter D. Diameter D may be about 100 nm. Diameter D may be between 50 nm and 300 nm. Diameter D may be between about 50 nm and 1 μm, or any subrange of these values. Pores 212 may be of a high aspect ratio. For example, a pore may be 200 nm in diameter, with a depth approximately defined by a thickness of the porous coating, which may be about 50 μm. Pores 212 of anodization layer 203 may be filled, e.g., as shown in FIG. 2B.

Figure 2B:
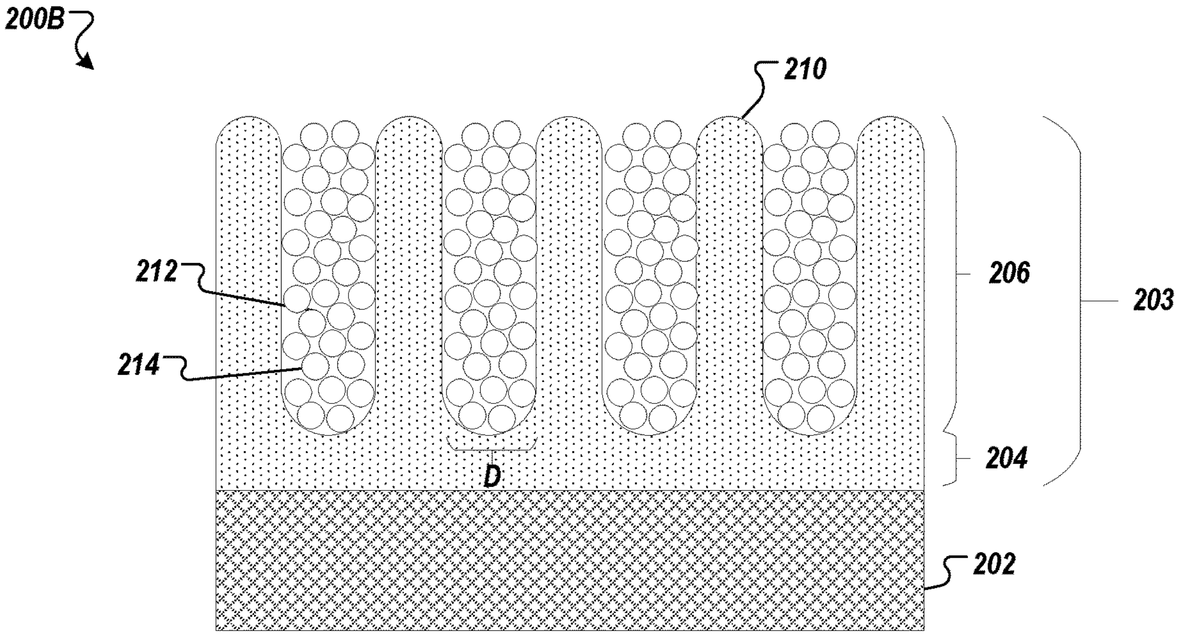
FIG. 2B is a sectional side view of a chamber component including a filled porous protective layer, according to some embodiments.

FIG. 2B is a cross-sectional view of a chamber component including a filled porous protective layer, according to some embodiments. A filled porous protective layer may be generated by applying a colloidal suspension to anodization layer 203. The colloidal suspension may include colloidal particles suspended in a solvent. The solvent may be water. The solvent may be another material, such as an organic solvent. The solvent may include additional materials, such as additives, acids or bases, salts, or other materials. Solvent additives may include sodium oxide, aluminum oxyhydroxide, acetate, ammonia, nitrate, etc. The colloidal particles may be of a concentration around 20 weight percent in the solution. The colloidal particles may be of a concentration between 10 and 30 weight percent in the colloidal solution. pH of the solution may be adjusted, e.g., to manipulate a particle charge of the colloid particles to encourage infiltration of the particles into coating pores, to encourage interaction or bonding of the particles with the coating, or the like. The colloidal particles may be smaller in diameter than diameter D of pores 212. For example, the colloidal particles may be about 10 nm in diameter. The colloidal particles may be approximately spherical. The colloidal particles may be between 10 nm and 100 nm in diameter. The colloidal particles may be between 1 nm and 100 nm in diameter. The colloidal particles may be metal oxide particles. The colloidal particles may be ceramic material. The colloidal particles may be of a metal oxide corresponding to article 202, anodization layer 203, etc. For example, article 202 may be of aluminum, anodization layer 203 may be of aluminum oxide, and colloidal particles 214 may be of alumina.

In some embodiments, colloidal particles 214 may be of approximately the same size. In some embodiments, colloidal particles 214 may be of a range of sizes, e.g., between 10 nm and 100 nm in diameter. In some embodiments, colloidal particles 214 may substantially fill pores 212. In some embodiments, colloidal particles 214 may partially fill, block, or obstruct pores 212.

A colloidal suspension may be applied to a surface of anodization layer 203 to fill pores 212 with the colloidal suspension. At least a portion of article 202 may be submerged in a suspension, the suspension may be washed, brushed, sprayed, or otherwise applied to the surface of article 202, etc.

After applying the colloidal suspension, the component 200A may be dried, cured, or the like. Component 200A may be dried to remove solvent from pores 212. Component 200A may be dried at room temperature, an elevated temperature, etc. Component 200A may be dried in a vacuum environment, a standard atmospheric environment, or another environment. Colloidal particles 214 may experience strong attraction to each other. Colloidal particles 214 may experience strong electrostatic forces. Colloidal particles 214 may experience attractive forces to sidewalls of pores 212. Colloidal particles 214 may be held in pores 212 after drying the filled anodized coating by electrostatic forces. Colloidal particles 214 may generate bonds with each other and/or the walls of pores in which they are disposed.

Figure 3:
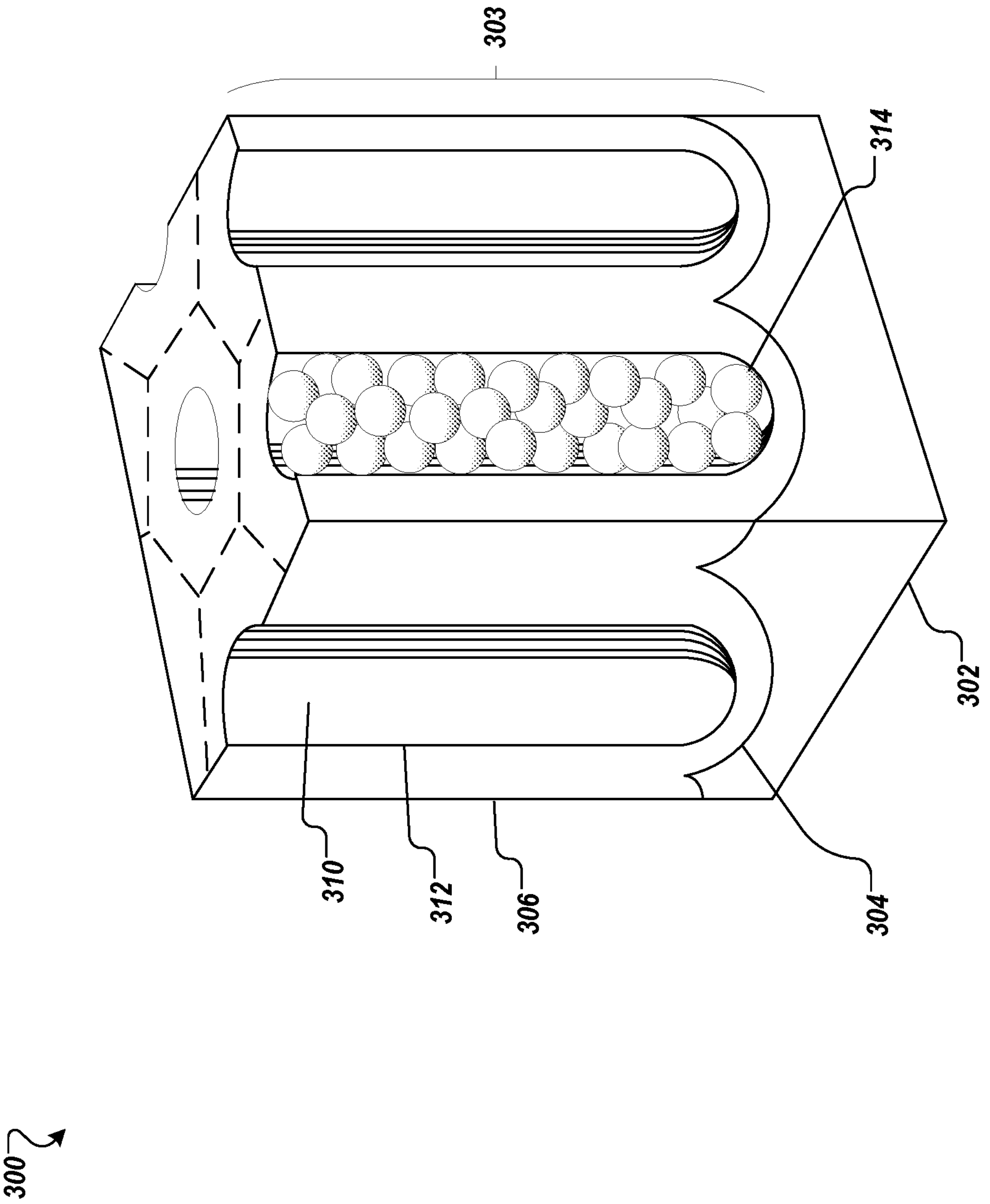
FIG. 3 is a cut-away perspective view of a protective porous coating of a chamber component, according to some embodiments.

FIG. 3 is a cut-away perspective view of a protective porous coating of a chamber component 300, according to some embodiments. Chamber component 300 includes article 302 and anodization layer 303 on the article. Anodization layer 303 includes buffer layer 304 and a porous layer 306. The buffer layer may be disposed between pores 312 and article 302. Porous layer 306 may include pores 312 and sidewalls 310. Porous layer 306 may include pores 312 that are approximately cylindrical in shape, including a diameter and a depth. Porous layer 306 may self-organize during the anodization process. Pores 312 may organize in an approximately hexagonal pattern, as depicted by the dotted lines on chamber component 300. Chamber component 300 may share one or more features with chamber components 200A and/or 200B, of FIGS. 2A-B.

FIG. 3 depicts empty pores and a pore filled with particles 314. Particles 314 may be nanoparticles, colloidal particles, etc. Particles 314 may be of a metal oxide. Particles 314 may be ceramic particles. Particles 314 may be of the same material as anodization layer 303. Particles 314 may be alumina, silica, yttria, or another oxide material.

Particles 314 may be approximately spherical. Particles 314 may fill, partially fill, obstruct, etc., one or more pores 312 of anodization layer 303. Particles 314 may be deposited in pores 312 by application of a colloidal suspension of particles. Introduction of particles 314 to pores 312 may be facilitated by a number of methods. Disposition of particles 314 in pores 312 may be performed with vacuum assistance. Disposition of particles 314 in pores 312 may be performed with electrostatic assistance, e.g., by manipulating surface charges of chamber component 300. Chamber component 300 may be dried, e.g., at room temperature, in an oven, in a vacuum chamber, etc., to remove solvent of the colloidal suspension to generated filled pores.

Figure 4A:
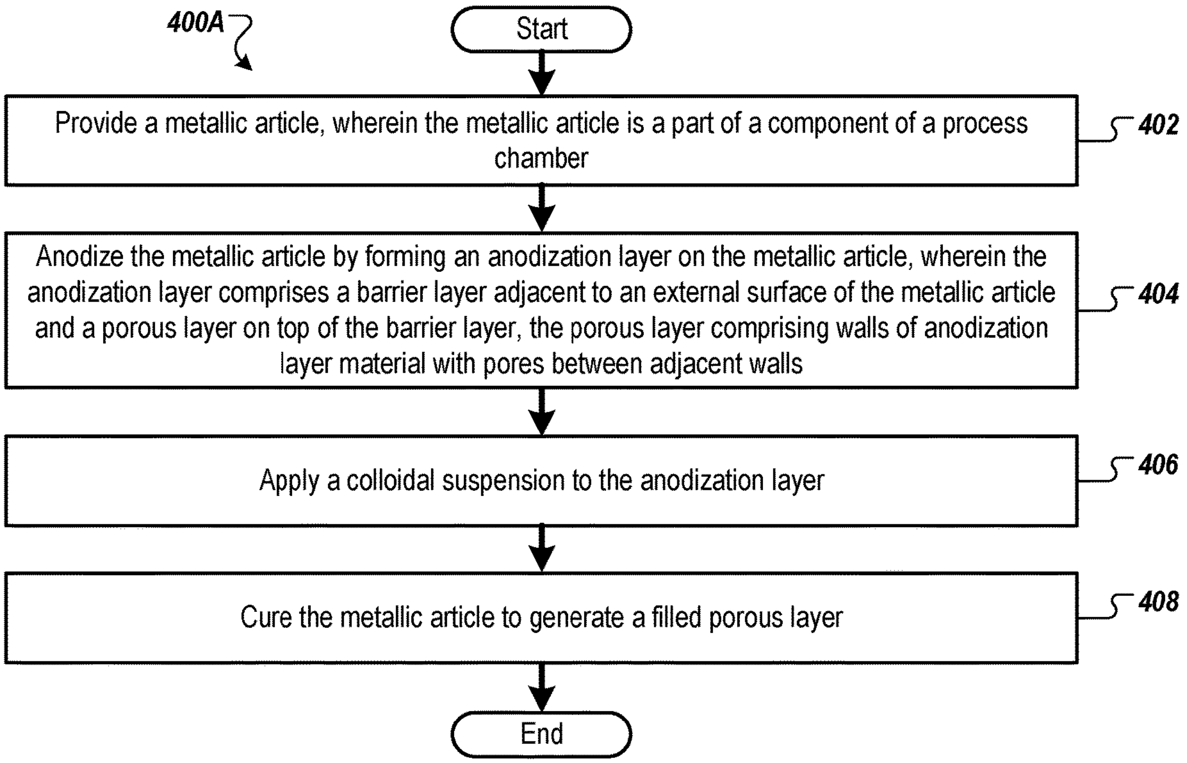
FIG. 4A is a flow diagram of a method for generating a filled porous protective layer of a component, according to some embodiments.

FIG. 4A is a flow diagram of a method 400A for generating a filled porous protective layer of a component, according to some embodiments. At block 402, a metallic article is provided. The metallic article is part of a component of a process chamber. The metallic article may include one or more surfaces of the component. The component may be part of a manufacturing system. The component may be part of a substrate processing system. The component may be part of a semiconductor processing and/or manufacturing system. The component may be part of a substrate support. The component may be aluminum. The component may be an alloy including aluminum. The component may be of another metallic material, such as magnesium, yttrium, titanium, alloys, etc. The component may be to generate a fluid seal, e.g., with a sealing component. The component may be susceptible to arcing, e.g., the component or nearby components may be electrically charged. The component may be to be used in a harsh or corrosive environment, such as corrosive gas environment, plasma environment, at elevated temperatures, or the like. Some preparation of the article may be performed, such as surface cleaning, surface preparation, surface finishing, surface polishing, surface roughening, or the like.

At block 404, the article is anodized to form an anodization layer. The anodization layer may be of a metal oxide. The anodization layer may be of a metal oxide corresponding to the material of the article. For example, an aluminum article may have an aluminum oxide ($Al_2O_3$) anodization layer. The anodization layer includes a porous layer, with pores extending through the porous layer. The anodization layer includes a barrier layer, which separates the article from the environment, from the pores, etc. The article may be dried after anodization, e.g., to remove residual moisture from pores of the anodization layer. The article may be dried at an elevated temperature, in a vacuum environment, or the like, after anodization. The porous layer of the anodization layer may includes pores, separated by walls of anodization material (e.g., $Al_2O_3$).

At block 406, a colloidal suspension is applied to the anodization layer. The colloidal suspension may include colloidal particles (e.g., nanoparticles) suspended in a solvent. The size of the colloidal particles may be smaller than the pore size of pores of the porous layer of the anodization layer. The colloidal particles may be about 1 nm in diameter, about 10 nm in diameter, about 50 nm in diameter, about 100 nm in diameter, or the like. The colloidal particles may be between 10 and 100 nm in diameter. The colloidal particles may be between 1 and 200 nm in diameter, or any sub-ranges or combinations of ranges of these.

The colloidal suspension may include particles of one or more ceramic materials. The colloidal suspension may include particles of one or more metal oxide materials. The colloidal suspension may include particles including alumina, silica, yttria, zirconia, etc. The colloidal suspension may include particles that include a metallic component that corresponds to a metallic component of the metallic article, a metallic component of the anodization layer, or the like.

At block 408, the metallic article is cured to generate a filled porous layer. The filled porous layer may include particles disposed within pores of the anodization layer. The metallic article may be cured to remove solvent associated with the colloidal suspension. The metallic article may be cured to generate bonds, attraction, affinity, connection, or the like, between particles disposed within the pores. The metallic article may be cured to generate bonds, attraction, or the like between particles disposed within the pores and the anodization material forming boundaries of the pores. Curing may include drying. Curing may include drying in an oven. Curing may include drying in a vacuum chamber. Curing may include drying in a vacuum oven.

Figure 4B:
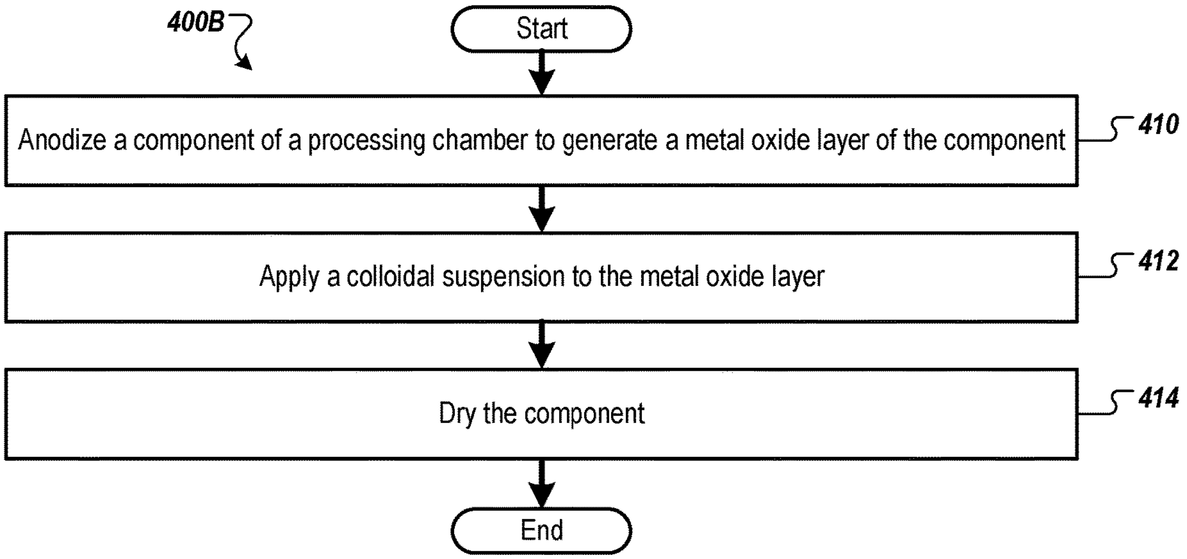
FIG. 4B is a flow diagram of a method for generating a filled porous protective coating, according to some embodiments.

FIG. 4B is a flow diagram of a method for generating a filled porous protective coating, according to some embodiments. At block 410, a component of a process chamber is anodized. Anodization generates a layer of metal oxide. In some embodiments, a portion of the surface of the component may be anodized. In some embodiments, anodization may be performed until a metal oxide layer (e.g., anodization layer) reaches a target thickness, depth, etc. The anodization layer may be on the order of micrometer thickness. The anodization layer may be about 50 μm thick. The anodization layer may be between 25 and 75 μm thick. The anodization layer may have a thickness between about 10 μm and 200 μm.

The component may be a component of a process chamber, manufacturing system, substrate manufacturing system, semiconductor manufacturing system, etc. The component may be a component of a substrate support assembly. The component may be used in a manufacturing system to generate a fluid seal. The component may be metal or a metal alloy. The component may be aluminum.

At block 412, a colloidal suspension may be applied to the metal oxide layer. The colloidal suspension may include nanoparticles of a metal oxide, ceramic material, or the like, suspended in a solvent. The colloidal suspension may include particles of alumina. The colloidal suspension may include particles of silica ($SiO_2$), zirconia ($ZrO_2$), yttria ($Y_2O_3$), etc.

At block 414, the component is dried. The component may be dried to remove solvent associated with the colloidal suspension. The component may be dried at room temperature or elevated temperature. The component may be dried at ambient pressure or vacuum pressures.

Unless specifically stated otherwise, terms such as "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose system selectively configured to perform methods described herein.

The terms "over," "under," "between," "disposed on," "support," and "on" as used herein refer to a relative position of one material layer or component with respect to other layers or components. For example, one layer disposed on, over, or under another layer may be directly in contact with the other layer or may have one or more intervening layers. Moreover, one layer disposed between two layers may be directly in contact with the two layers or may have one or more intervening layers. Similarly, unless explicitly stated otherwise, one feature disposed between two features may be in direct contact with the adjacent features or may have one or more intervening layers.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method, comprising:

forming a porous ceramic layer on a component of a processing chamber;

applying a colloidal suspension to the porous ceramic layer to fill pores of the porous ceramic layer; and drying the component, comprising the porous ceramic layer and particles disposed within the porous ceramic layer which were applied in the colloidal suspension, wherein the particles seal the pores of the porous ceramic layer.

2. The method of claim 1, wherein:

the porous ceramic layer comprises a metal oxide layer; and forming the porous ceramic layer comprises anodizing the component to generate the metal oxide layer.

3. The method of claim 1, wherein the component comprises a component of a substrate support assembly.

4. The method of claim 1, wherein the component comprises aluminum, and wherein the porous ceramic layer comprises alumina.

5. The method of claim 1, wherein the colloidal suspension comprises metal oxide particles suspended in a solvent.

6. The method of claim 5, wherein the metal oxide particles comprise alumina particles.

7. The method of claim 1, wherein forming the porous ceramic layer comprises performing plasma spraying.

8. The method of claim 1, wherein the porous ceramic layer has a porosity of 1-15%.

9. The method of claim 1, wherein the porous ceramic layer comprises a metal fluoride or a metal oxy-fluoride.

10. The method of claim 1, wherein the colloidal suspension comprises at least one of metal oxide particles, metal fluoride particles or metal oxy-fluoride particles suspended in a solvent.

* * * * *